United States Patent [19]

Lutfy

[11] Patent Number: 4,559,580
[45] Date of Patent: Dec. 17, 1985

[54] SEMICONDUCTOR PACKAGE WITH INTERNAL HEAT EXCHANGER

[75] Inventor: Gary J. Lutfy, Rockford, Ill.

[73] Assignee: Sundstrand Corporation, Rockford, Ill.

[21] Appl. No.: 549,208

[22] Filed: Nov. 4, 1983

[51] Int. Cl.⁴ .............................................. H05H 7/20
[52] U.S. Cl. .................... 361/385; 165/104.33; 165/80.4; 174/15 R; 357/82; 361/388
[58] Field of Search .......... 165/80 B, 80 D, 104.33; 174/15 R, 15 HP; 357/82, 76; 361/381–388, 395, 415; 62/418

[56] References Cited

U.S. PATENT DOCUMENTS

| 2,942,165 | 6/1960 | Jackson et al. | 357/82 |
| 3,275,921 | 9/1966 | Fellendorf et al. | 363/141 |
| 3,361,195 | 2/1968 | Meyerhoff et al. | 165/80 R |
| 3,365,620 | 1/1968 | Butler et al. | 361/382 |
| 3,437,132 | 4/1969 | Venema | 165/80 R |
| 3,551,758 | 12/1970 | Ferree | 357/82 |
| 3,643,131 | 2/1972 | Scherbaum | 361/385 |
| 3,715,632 | 2/1973 | Warburton | 357/79 |
| 3,739,235 | 6/1973 | Kessler, Jr. | 174/15 HP |
| 3,794,886 | 2/1974 | Goldman | 361/382 |
| 3,800,190 | 3/1974 | Marek | 174/15 HP |
| 3,826,957 | 7/1974 | McLaughlin et al. | 174/15 HP |
| 3,852,804 | 12/1974 | Corman et al. | 174/15 HP |
| 3,852,805 | 12/1974 | Brzozowki | 165/104.33 |
| 3,852,806 | 12/1974 | Corman et al. | 174/15 HP |
| 3,912,001 | 10/1975 | Missman et al. | 361/382 |
| 3,913,003 | 10/1975 | Felkel | 357/75 |
| 3,921,201 | 11/1975 | Eisele et al. | 357/82 |
| 3,925,802 | 12/1975 | Watanabe et al. | 357/82 |
| 3,978,518 | 8/1976 | Kessler, Jr. et al. | 357/82 |
| 3,984,861 | 10/1976 | Kessler, Jr. | 357/82 |
| 3,989,099 | 11/1976 | Hosomo et al. | 165/80 R |
| 4,009,423 | 2/1977 | Wilson | 361/385 |
| 4,010,489 | 3/1977 | Bourbeau et al. | 357/82 |
| 4,023,616 | 5/1977 | Scherbaum | 165/80 R |
| 4,029,141 | 6/1977 | Ferrari et al. | 165/80 R |
| 4,037,270 | 7/1977 | Ahmann et al. | 361/385 |
| 4,051,509 | 9/1977 | Beriger et al. | 361/385 |
| 4,126,883 | 11/1978 | Martin | 357/76 |
| 4,142,577 | 3/1979 | Klein | 165/80 R |
| 4,178,630 | 12/1979 | Olsson | 363/141 |
| 4,183,042 | 1/1980 | Novak et al. | 357/82 |
| 4,188,996 | 2/1980 | Pellant et al. | 361/385 |
| 4,292,647 | 9/1981 | Lee | 357/81 |
| 4,386,362 | 5/1983 | Kessler, Jr. et al. | 357/82 |
| 4,431,980 | 2/1984 | Ikegawa et al. | 361/385 |
| 4,494,171 | 1/1985 | Bland et al. | 361/385 |

Primary Examiner—Harry E. Moose, Jr.
Assistant Examiner—Gregory D. Thompson
Attorney, Agent, or Firm—Wood, Dalton, Phillips, Mason & Rowe

[57] ABSTRACT

An internally cooled semiconductor package including a wafer-like semiconductor body with at least two electrical elements, one at a relatively flat surface of the body. A wall of high electrical and heat conductive material abuts the flat surface of the semiconductor body to be in good heat conductive relation therewith and in electrical contact with the same. A fluid flow heat exchanger is on the other side of the wall in heat exchange relation therewith and along with the wall and other components serves to encapsulate the semiconductor.

4 Claims, 8 Drawing Figures

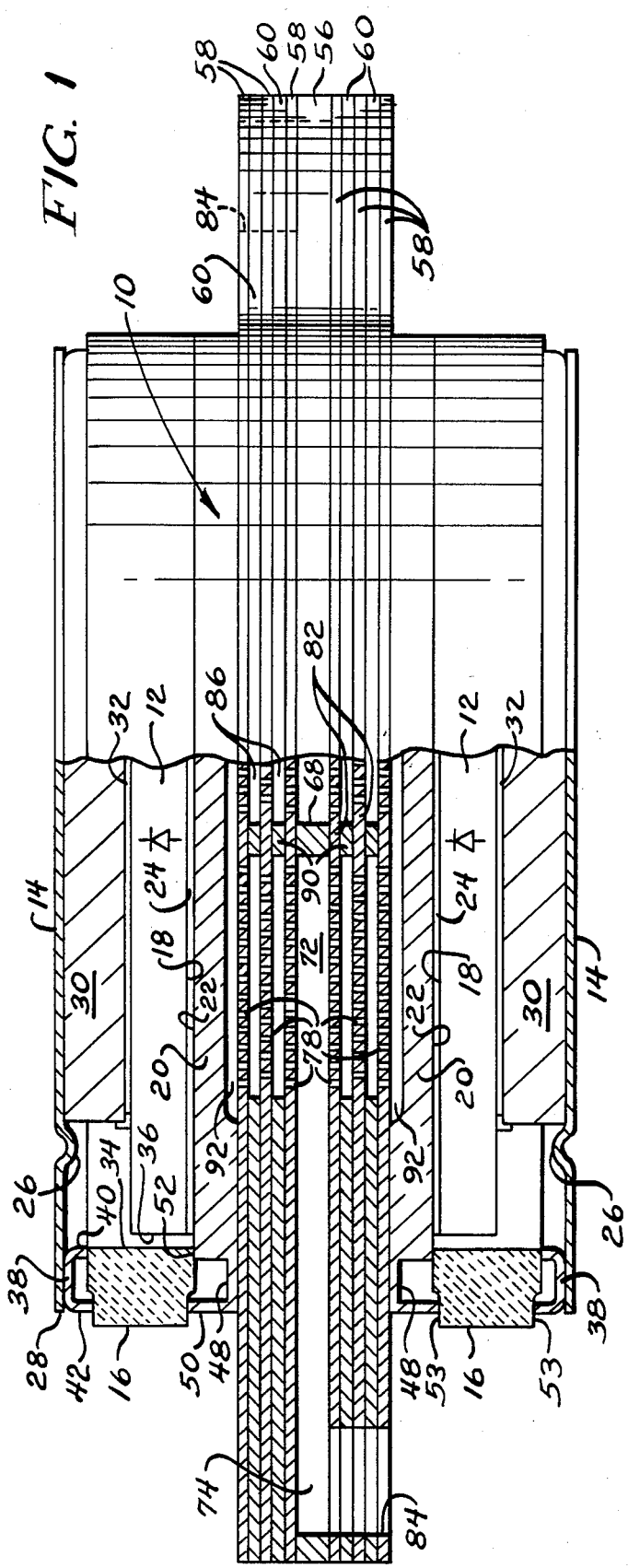
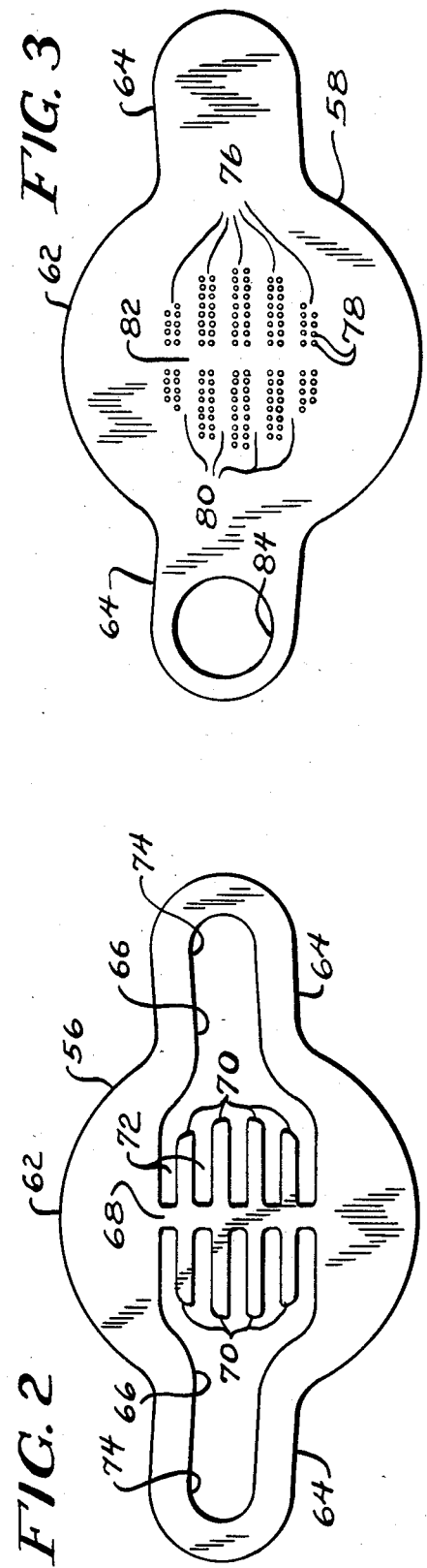

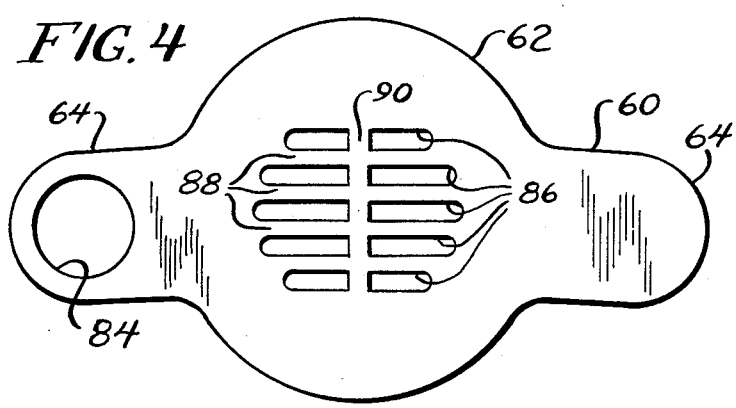
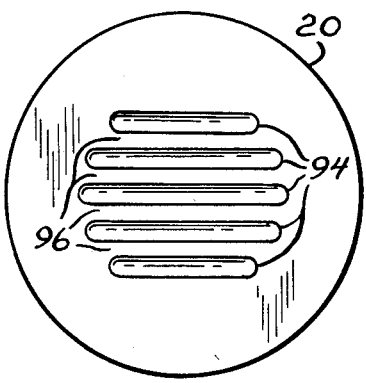
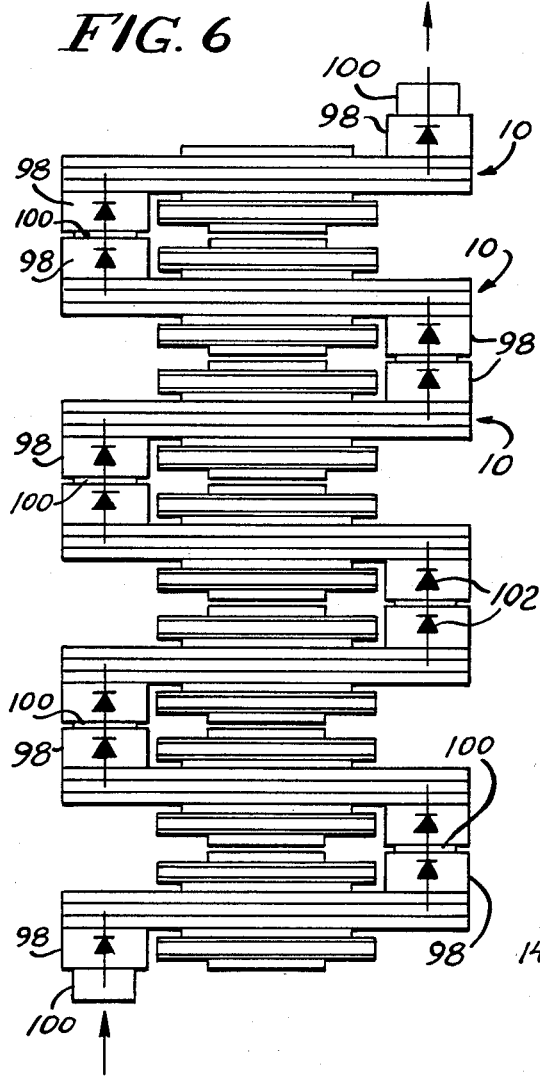
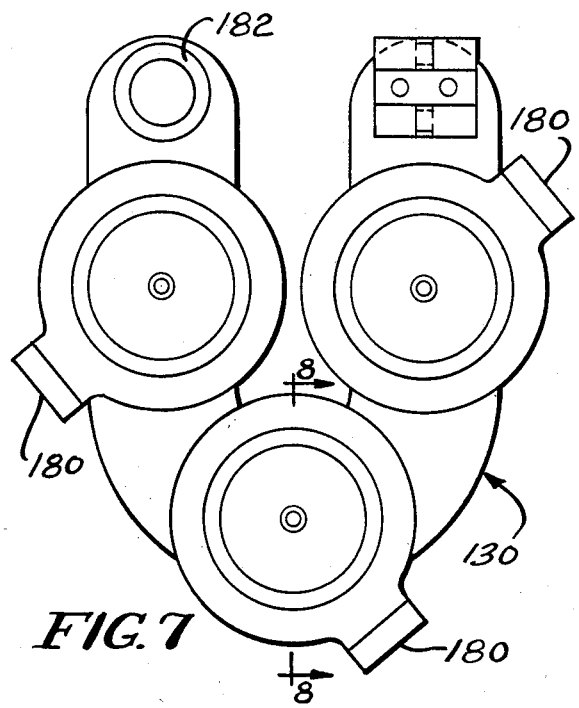
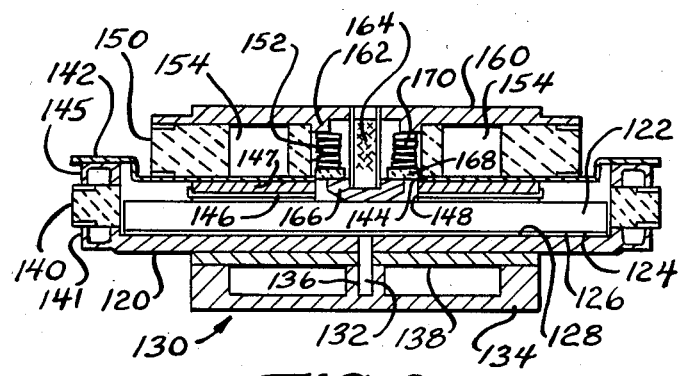

SEMICONDUCTOR PACKAGE WITH INTERNAL HEAT EXCHANGER

FIELD OF THE INVENTION

This invention relates to the cooling of electrical semiconductors, and more particularly, to a package for semiconductors which includes an internal heat exchanger for cooling purposes.

BACKGROUND ART

Over the years, there has been considerable recognition of the need to cool semiconductors, as, for example, diodes, rectifiers, transistors, etc. in a variety of different applications for such components. In general, this has been accomplished by mounting a semiconductor, usually in already encapsulated form, to a heat exchanger by such means as clamps, bolts, screws, etc. Exemplary of this approach are the following U.S. Letters Patents: U.S. Pat. No. 2,942,165 issued June 21, 1960 to Jackson; U.S. Pat. No. 3,275,921 issued Sept. 27, 1966 to Fellendorf; U.S. Pat. No. 3,361,195 issued Jan. 2, 1968 to Meyerhoff; U.S. Pat. No. 3,365,620 issued Jan. 23, 1968 to Butler; U.S. Pat. No. 3,437,132 issued Apr. 8, 1969 to Venema; U.S. Pat. No. 3,551,758 issued Dec. 29, 1970 to Ferree; U.S. Pat. No. 3,643,131 issued Feb. 15, 1972 to Scherbaum; U.S. Pat. No. 3,715,632 issued Feb. 6, 1973 to Warburton; U.S. Pat. No. 3,794,886 issued Feb. 26, 1974 to Goldman; U.S. Pat. No. 3,913,003 issued Oct. 14, 1975 to Felkel; U.S. Pat. No. 3,921,201 issued Nov. 18, 1975 to Eisele; U.S. Pat. No. 3,989,099 issued Nov. 2, 1976 to Hosono; U.S. Pat. No. 4,009,423 issued Feb. 22, 1977 to Wilson; U.S. Pat. No. 4,010,489 issued Mar. 1, 1977 to Boubeau; U.S. Pat. No. 4,023,616 issued May 17, 1977 to Scherbaum; U.S. Pat. No. 4,029,141 issued June 14, 1977 to Ferrari; U.S. Pat. No. 4,036,270 issued July 19, 1977 to Ahmann; U.S. Pat. No. 4,142,577 issued Mar. 6, 1979 to Kline; U.S. Pat. No. 4,178,630 issued Dec. 11, 1979 to Olsson; and U.S. Pat. No. 4,292,647 issued Sept. 29, 1981 to Lee.

While the approaches exemplified by the foregoing patents have achieved some degree of success, because they are basically an "add-on" structure for existing semiconductor components, they frequently are quite bulky both in size and in weight and have circuitous and/or unnecessarily resistive heat exchange paths which may employ inefficient thermal conductors and/or interfaces thereby impeding efficiency of heat transfer to a coolant.

Other semiconductor cooling arrangements using unencapsulated semiconductor wafers with heat exchangers as an integral part of the semiconductor package have been proposed in, for example, U.S. Pat. No. 4,079,410 issued Mar. 14, 1978 to Schierz and U.S. Pat. No. 4,209,799 issued June 24, 1980, also to Schierz. Proposals such as those of Schierz to some extent avoid the add-on nature of the heat exchanger in other prior devices but do not provide a means to cut down on bulk and are not particularly well suited for miniaturization. Moreover, though while the heat exchangers employed are not "add-on" types in the same sense as the previously identified prior art, they may be so-called add-on type heat exchangers in the sense that the joining method employed almost acts as the clamping elements such as bolts, screws, or the like used in other proposals. As a consequence, undesirably resistive heat exchange paths can still exist.

In the commonly assigned application of Niggemann, Ser. No. 411,059, filed Aug. 24, 1982, and entitled "Compact High Intensity Cooler", the details of which are herein incorporated by reference, there is disclosed a heat exchanger capable of substantial miniaturization and high thermal efficiency. Unlike conventional heat exchangers, that described by Niggemann can efficiently handle relatively high heat fluxes in a small volume heat exchanger having relatively low power requirements for pumping a heat exchange fluid. According to one math model, to achieve the same cooling achieved in one embodiment of the heat exchanger employing the principal of the Niggemann exchanger, at the same coolant temperature it would require a pressure differential of some 350 times that required by the Niggemann invention to achieve the requisite coolant flow in a conventional copper plate-fin heat exchanger with high density fin spacing. Thus, to achieve such a pressure drop flow rate, greater power requirements would be necessary.

The present invention, in one aspect thereof, seeks to take advantage of the invention of Niggemann in cooling semiconductors. In other aspects, the present invention seeks to overcome the bulk difficulties and inefficiently resistive heat transfer paths posed by the prior art.

SUMMARY OF THE INVENTION

It is the principal object of the invention to provide a new and improved semiconductor package with an internal heat exchanger.

According to the invention, there is provided a wafer-like semiconductor body having at least two electrical elements, one at a relatively flat surface of the body. A wall of high electrical and heat conductive material is provided and has one side in substantial abutment with the flat surface of the body to be in heat conductive relation therewith and in electrical contact with one of the electrical elements. A fluid flow heat exchanger is on the other side of the wall in heat exchange relation therewith and means are provided, including at least one of the wall and heat exchanger, for encapsulating the body.

According to a highly preferred embodiment of the invention, the wall forms the fluid boundary of the heat exchanger.

In one form of the invention, there are two walls in spaced relation with each other and forming a fluid boundary of a single heat exchanger and there are two of the semiconductor bodies, each in substantial abutment with the respective one of the walls. A pair of electrically conductive means sandwich the body against the respective wall and form part of the encapsulating means.

The invention envisions that the encapsulating means further comprise a pair of electrically insulating rings, each surrounding the periphery of an associated one of the semiconductor bodies and interposed between the associated electrically conductive means and wall to define encapsulating spaces for the semiconductor bodies.

Preferably, the heat exchanger is comprised of a series of plates sandwiched by the walls, the series including a central distribution plate and alternating apertured and baffle plates on each side of the central plate. The apertures in each of the apertured plates are staggered with respect to the apertures in the adjacent apertured plates.

In a highly preferred embodiment, each of the plates in the walls include aligned solid portions separating flow paths therethrough which are in abutment with each other. The plates are of a thermally conductive material such that the abutting solid portions facilitate heat transfer from the wall to the interior of the heat exchanger. As a consequence, a multiple surface heat exchanger in good heat conductive relation to the wall abutting the semiconductor is provided to maximize thermal efficiency.

Other objects and advantages will become apparent from the following specification taken in connection with the accompanying drawings.

DESCRIPTION OF THE DRAWINGS

FIG. 1 is an elevational view of a semiconductor package made according to the invention with parts broken away and parts shown in section for clarity;

FIG. 2 is a plan view of a distribution plate employed in the heat exchanger of the embodiment of FIG. 1;

FIG. 3 is a plan view of an apertured plate employed in the heat exchanger;

FIG. 4 is a plan view of a baffle plate employed in the heat exchanger;

FIG. 5 is a plan view of a disk or wall element forming part of the heat exchanger and an electrical contact for contacting a semiconductor;

FIG. 6 is a somewhat schematic view illustrating how a plurality of the passages shown in FIG. 1 may be stacked;

FIG. 7 is a plan view of a modified embodiment of the invention; and

FIG. 8 is an enlarged sectional view taken approximately along the line 8—8 in FIG. 7.

DESCRIPTION OF THE PREFERRED EMBODIMENT

One embodiment of a semiconductor package made according to the invention is illustrated in FIG. 1 in the form of a two diode package having an internal heat exchanger. As will be seen, the principles of the invention are not limited to use with diodes, but may be applied to other semiconductors as well.

With reference to FIG. 1, the package includes a central heat exchanger, generally designated 10, sandwiched by diodes 12. The assembly of the heat exchanger 10 and the diodes 12 in turn is sandwiched by housing closures 14 which additionally serve as electrical contacts. Insulators 16 separate the closures 14 from each other and from the heat exchanger 10, both electrically and physically.

The diodes 12 are formed of wafer-like semiconductor bodies as is well known and have two electrical elements, a cathode and an anode, as is conventional. Each includes a relatively flat surface 18 which serves as one of the electrical elements for purposes of description herein.

The heat exchanger 10 includes opposed walls 20 defined by disk-like elements made of a high heat conductive and high electrically conductive material as, for example, copper. Each of the walls 20 has a flat surface 22 which is adapted to be in substantial abutment with the surface 18 of a corresponding one of the diodes 12. The purpose is to achieve electrically conductive and heat conductive contact between the walls 20 and the diodes 12 at the surfaces 18 and in order to accommodate small imperfections in the surfaces 18 or 22 that might impede both electrical and thermal conductivity, a thin layer of soft silver foil 24 is disposed between the surfaces 18 and 22. As will be seen, in fabricating the semiconductor package, compressive force is applied and such will cause the silver foil 24 to fill any surface irregularities in either of the surfaces 18 or 22 to thereby assure excellent heat and electrical conductivity across the interface.

The closures 14 are made of thin disks of copper and include annular dimples or grooves 26 located inwardly of their marginal edges 28. The dimples 26 provide for thermal and mechanical stress relief during assembly.

In abutment with the surface of the diodes 12 opposite the surfaces 18, and centered by the dimples 26 are copper contact wafers 30. A thin layer of silver foil 32 may be employed between the wafers 30 and the diodes 12 for the same reasons as the foil 24 is employed. Preferably, the wafers 30 are bonded to the closures 14 by brazing or the like.

The diodes 12 are physically housed by the heat exchanger 10, the closures 14 and the insulators 16. The insulators 16 are in the form of annular rings having inner diameters 34 sized to receive the peripheral edges 36 of the diodes 12. The insulators 16 are preferably formed of aluminum oxide or the like and are soldered or brazed, on opposite sides, to the walls 20 and the closures 14. In the case of the bond to the closures 14, the same is achieved through the use of an annular channel 38 having its bight secured to the closure 14 adjacent the peripheral edge 28 as by welding. The radial inner leg 40 of the channel 38 rests on the insulating ring 16 adjacent its radially inner surface 34 while the radially outer leg 42 is brazed to the insulator 16 near its outer periphery. This construction is preferred over direct securement of the closure 14 to the insulator 16 in that considerable thermal stress relief is provided to prevent cracking or fracturing of the insulators 16 during the assembly process due to the mismatch of coefficients of thermal expansion.

The walls 20, near their periphery, each have an annular groove 48 which in turn defines a finger 50 and a small ledge 52, both of which abut the side of the insulator 16 opposite from the annular channel 38, and specifically, opposite the legs 42 and 40 respectively. Securement of the walls 20 to the insulators 16 is likewise made by brazing and this configuration is preferred over one lacking the annular groove 48 since it too provides highly desirable thermal stress relief during assembly. Desirably, the insulators 16 are provided with small reliefs such as shown at 53 for receipt of so-called "preforms" of brazing material which may be assembled to the insulators 16 prior to final assembly of the package.

Turning now to the heat exchanger 10, the same is made up of the walls 20 as mentioned earlier along with a series of stacked plates. The stacked plates include a central distributor plate 56 which is flanked on either side by alternating aperture plates 58 and baffle plates 60. Each of the plates 56–60 is made of material having a high thermal conductivity such as copper. However, it is to be noted that highly thermally conductive materials which are insulators may be employed as desired dependent upon the intended electrical configuration of the package. In the particular package illustrated in FIG. 1, it is desired to electrically connect one element of one of the diodes 12, such as the cathode, to the opposite element of the other diode 12, namely, the anode, and to this end, all of the plates 56–60 and the walls 10 are electrically conductive. Were such a connection not desired, one or more of the plates as, for example, the central distributor plate 56, could be formed of a highly thermally conductive, electrically insulating material to provide electrical isolation between the two diodes 12.

Turning now to FIGS. 2–4, each of the plates 56–60 has a circular central section 62 from which extend, in generally opposite directions, opposed tabs 64.

Referring now to FIGS. 1 and 2, the distributor plate 56 has a pair of facing fork-shaped cut-outs 66. The two are separated by a web 68 to which is joined a plurality of solid fingers 70. The fingers 70 separate the cut-outs 66 into a series of interconnected slots 72 in the central circular portion 62 which are joined to a channel 74 extending well into the confines of the tabs 64.

Turning now to FIG. 3, the aperture plates 58 include five rows 76 of apertures 78 alignable with respective slots 72. The apertures are not restricted to a particular size, but for an application such as shown in FIG. 1, may range from a few thousandths of an inch in diameter up to several hundredths of an inch in diameter.

Each row 76 has two lines of the apertures 78 and the rows are separated by solid webs 80 alignable with the fingers 70 (FIG. 2) of the distributor plate 56. In addition, each row 76 is severed at its mid point by a transverse web 82 alignable with the web 68 on the distributor plate 56.

One of the tabs 64 of the plate 58 is provided with an enlarged opening 84 which serves as a fluid port as will be seen. In the case of the plates 58 employed below the distributor plate 56 as seen in FIG. 1, the left-hand tab 64 will be provided with the opening 84. Conversely, in the case of the aperture plates 58 employed above the distributor plate 56 as seen in FIG. 1, the aperture 84 will appear in the righthand tab 64.

As seen in FIG. 1, the aperture plates 56 are not identical. Specifically, the arrangement is such that the apertures 78 in adjacent plates are not aligned, but rather, staggered. For manufacturing convenience, every other apertured plate 58 may be identical in configuration.

Referring now to FIGS. 1 and 4, the baffle plates 60 will be described. They likewise are provided with a port-like opening 84 in one or the other of the tabs 64 according to the same criteria enunciated previously with respect to the plates 58. The baffle plates 60 also include five rows of slots 86 in the central circular section 62 which align with the rows 76 and the slots 72 in the plates 58 and 56 respectively. The slots 86 are separated by webs 88 which align with the webs 80 and fingers 70 and the slots in each row are separated by a transverse web 90 alignable with the webs 68 and 82.

As best seen in FIG. 1, the side of each wall 20 facing the plates 56–60 is provided with a recess 92. As seen in FIG. 5, the recess 92 is in the form of elongated grooves 94 in the wall 20. The grooves 94 are alignable with the slots 72, the rows 76, and the slots 86 in the plates 56–60 respectively and are separated by lands 96 which are alignable with the fingers 70, the webs 80 and the webs 88 in the plates 56–60 respectively.

The various components are assembled in the interrelationship illustrated in FIG. 1 and with the alignment previously described and then diffusion bonded together. As is well known, diffusion bonding is achieved by placing the components in abutment with each other under substantial pressure at a temperature approaching, but not at, the melting point of the material employed and in a vacuum. As a consequence, extremely intimate contact and bonding between the components is achieved to provide for excellent heat transfer across the interfaces of the components.

It will be appreciated from the foregoing description that a coolant may be introduced through the openings 84 on one end of the heat exchanger 10 by means of suitable fitting (not shown). The coolant will flow, as viewed in FIG. 1, upwardly, to the distributor plate and then laterally toward the web 68. The coolant will then flow through the apertures 78 in an aperture plate 58 and through the slots 86 in the baffle plates to impinge upon the adjacent aperture plate 58. Impingement on the plate will occur because of the non-alignment of the apertures 78 in adjacent plates as mentioned previously. Such flow will continue through the aperture plates 58 until the fluid impinges upon the walls 20, and specifically, the bottoms of the grooves 94 therein at which time the fluid will again flow laterally until the ends of the grooves are reached. The flow will then turn through the apertured plates 58 in a direction toward the distributor plate 56 until the same is then reached at which time it will flow laterally through the openings 84 in the tabs 64 on the opposite end of the stack.

Short circuiting of such fluid flow is, of course, prevented by the presence of the solid aligned webs or portions 68, 82 and 90 in the various plates.

Because the fingers 70, webs 80 and 88, and lands 96 on the plates 56 and wall 20 are all aligned and intimately bonded together, a highly thermally conductive path from the exterior to the interior of the heat exchanger 10 is provided. Thus, heat generated by either diode 12 readily flows to the same wall 20 with which it is in substantial abutment and then through the webs 68, 82 and 90 as well as the fingers 70 and webs 80 and 88 and laterally along each of the plates to be intimately contacted by the coolant flowing through the construction. In a typical case, a substantial majority of the heat being dissipated from the diodes 12 is transferred at interior points within the heat exchanger 10 with only a minor percentage being transferred from the wall 20 to fluid flowing in the grooves 94 therein.

Electrical connections to the package at desired locations can be made in any of a variety of ways. Any of a variety of spring loaded contact connections can be made, or desirably, integral terminals may be formed on the closures 14 or any of the plates 56–60 simply by forming an integral, generally radially extending tab (not shown) thereon. Alternatively, stacking of packages with contact between conductive components may be employed.

FIG. 6 illustrates, somewhat schematically, how a plurality of semiconductor packages as illustrated in FIG. 1 may be stacked and interconnected for serial cooling by bosses 98 brazed to the heat exchanger 10 about the openings 84 and interfitted nipples 100. Cooling can be achieved through the use of either liquid or gaseous coolants as desired. Polarity indicia 102 may be employed on the bosses to facilitate proper hook-up.

Turning now to FIGS. 7 and 8, a modified embodiment of the invention will be seen. This embodiment of the invention illustrates the application of the inventive concept to a three element semiconductor as, for example, a transistor. The same includes a disk-like wall 120 of highly electrically and thermally conductive material such as copper which is in substantial abutment with a wafer-like body 122 of a semiconductor having three elements, an emitter, a base and a collector. The body 122 has a substantially flat surface 124 which is the collector and a thin layer of soft silver foil 126 is interposed between the surface 124 and a flat surface 128 on the wall 120 for the purposes mentioned previously.

A heat exchanger, generally designated 130, is located by pin 132 and brazed to the wall 120 on the side thereof opposite from the surface 128. The heat exchanger 130 may be of the type generally described previously in connection with the embodiment illustrated in FIGS. 1–5 or may simply include a channel 134, W-shaped in cross-section, having a control wall 136 for structural integrity and receipt of the pins 132. The channel may be closed by a closure 138 interposed between the channel 134 and the wall 120 and formed of highly thermally conductive material as, for example, copper or copper with a very small percentage of alumina to increase its strength. As a consequence, heat generated in the body 122 need only traverse the wall 120 to the heat exchanger 130 to be suitably dissipated.

The body 122 is in part housed by a ceramic insulating ring 140 similar in structure and function to the insulator 16 described previously. The insulator 140 is bonded to a finger 141 on the wall 120 as by brazing. The finger 141 is provided for mechanical and thermal stress relief, i.e., for the same purpose as the finger 50 in the embodiment of FIGS. 1–5. The circular cavity thus defined housing the body 122 is partially closed by a stepped circular plate 142 formed of copper or the like and having a central opening 144. The plate 142 is brazed to the insulating ring 140 via an annular channel 145 serving the same function as the channel 38 in the embodiment of FIGS. 1–5. A copper washer 147 brazed to the plate 142 serves as an electrical terminal for the construction as, for example, by connection to the emitter of the transistor via soft silver foil 146. As can be seen in FIG. 8, the foil 146 is provided with a central aperture 148 aligned with the aperture 144 in the plate 142.

A further insulating ring 150, formed of aluminum oxide or the like, is brazed to the upper surface of the plate 142 and includes a central aperture 152 aligned with the apertures 144 and 148. To achieve a weight savings, a series of circular openings 154 are formed in the ring 150 at a variety of locations about the central aperture 152.

A copper plate 160 is brazed to the upper surface of the ring 150 and includes an annular, downwardly extending ridge 162 received in the central aperture 152 of the insulating ring 150. Centrally of the plate 160, and sealed with respect thereto, is a woven wire cable 164 which extends downwardly through the central apertures of the components to a conductive button 166 in electrical engagement with the base of the transistor forming the body 122. The upper surface of the button 166 is engaged by a washer 168 formed of electrically insulating material and a series of small Belleville washers 170 is interposed between the washer 168 and the underside of the ridge 162. As a result, the button 166 is tightly urged into good electrical contact with the base of the transistor.

The woven wire cable 164 provides an electrical connection from the button 166 to the copper plate 160. Consequently, electrical connections to the various elements of the body 122 may be made by the formation of tabs or the provision of terminals on the wall 120 to achieve connection to the collector of the transistor, the plate 142 to achieve connection to the emitter of the transistor, and the plate 160 to achieve connection to the base of the transistor.

FIG. 7 illustrates how three of the transistors illustrated in FIG. 8 may be arranged, for compactness, in a generally planar configuration on a common heat exchanger 130. As can be discerned from FIG. 7, the heat exchanger 130, including the channel 134 and the closure 138 are U-shaped in configuration such that three of the transistors may be mounted thereon via their walls 120. Electrical tabs or terminals 180 are illustrated as is an upwardly facing coolant port 182. The opposite leg of the U includes a downwardly facing coolant port (not shown).

Of course, for greater heat exchange efficiency, if the mounting illustrated in FIG. 7 is not to be employed, that is, the semiconductors are to be individually mounted, the closure 138 may be omitted and the channel 134 sealed directly to the wall 120.

From the foregoing, it will be appreciated that the invention provides a highly efficient, internally cooled, semiconductor package of minimal bulk. In each case, the semiconductor wafer is thoroughly sealed within other components of the configuration for reliability by the brazing of the components together to provide encapsulation. At the same time, it will be appreciated that the length of heat transfer paths is minimized without sacrificing compactness of the overall construction.

I claim:

1. A semiconductor package with internal heat exchanger comprising:
   a wafer-like semiconductor body having at least two electrical elements; one at a relatively flat surface of said body;
   a wall of high electrical and heat conductive material, said wall having one side in substantial abutment with said flat surface of said body to be in heat conductive relation therewith and in electrical contact with said one of said elements;
   a fluid flow heat exchanger on the other side of said wall in heat exchange relation therewith; and
   means including said wall and encapsulating said body,
   there being two said walls in spaced relation, each forming a fluid boundry of said heat exchanger, and there being two said bodies, each in substantial abutment with a respective wall, and a pair of electrically conductive means sandwiching each said body against the respective wall and forming part of said encapsulating means; said heat exchanger being comprised of a series of plates sandwiched by said walls, said series including a central distribution plate and alternating apertured and baffle plates on each side thereof.

2. The semiconductor package of claim 1 wherein said encapsulating means further comprise a pair of electrically insulating rings, each surrounding the periphery of an associated one of said bodies and interposed between the associated electrically conductive means and walls to define encapsulating spaces for said bodies.

3. The semiconductor package of claim 1 wherein the apertures in each said apertured plates are staggered with respect to the apertures in the adjacent apertured plates.

4. The semiconductor package of claim 1 wherein each of said plates include aligned solid portions separating flow paths therethrough and said portions are in abutment with each other, and said plates are of a thermally conductive material to facilitate heat transfer from said walls to the interior of said heat exchanger.

* * * * *